US006730358B2

(12) United States Patent
Yamuni et al.

(10) Patent No.: US 6,730,358 B2
(45) Date of Patent: May 4, 2004

(54) METHOD FOR DEPOSITING CONDUCTIVE PASTE USING STENCIL

(75) Inventors: Charbel Yamuni, Stockton, CA (US); Michael G. Lee, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/791,265

(22) Filed: Feb. 22, 2001

(65) Prior Publication Data
US 2003/0035886 A1 Feb. 20, 2003

(51) Int. Cl.$^7$ ................................................. B05D 5/12
(52) U.S. Cl. ........................... 427/282; 427/96; 427/97; 427/350; 101/129
(58) Field of Search ............... 427/96, 97, 350, 427/282; 118/504; 101/129

(56) References Cited

U.S. PATENT DOCUMENTS

| | | | |
|---|---|---|---|
| 4,622,239 A | 11/1986 | Schoenthaler et al. | |
| 4,704,305 A | * 11/1987 | Berger et al. | 427/96 |
| 4,708,281 A | 11/1987 | Nelson et al. | |
| 4,720,402 A | 1/1988 | Wojcik | |
| 4,720,412 A | 1/1988 | Katoh et al. | |
| 4,934,309 A | 6/1990 | Ledermann et al. | |
| 4,961,955 A | 10/1990 | Goldberg | |
| 5,193,738 A | 3/1993 | Hayes | |
| 5,197,655 A | 3/1993 | Leerssen et al. | |
| 5,275,970 A | 1/1994 | Itoh et al. | |
| 5,292,054 A | 3/1994 | Leeb et al. | |
| 5,328,078 A | 7/1994 | Okumura | |
| 5,356,658 A | * 10/1994 | Hertz et al. | 427/96 |
| 5,364,011 A | 11/1994 | Baker et al. | |
| 5,389,148 A | * 2/1995 | Matsunaga | 118/300 |
| 5,395,643 A | 3/1995 | Brown et al. | |
| 5,415,337 A | 5/1995 | Hogan et al. | |
| 5,565,033 A | 10/1996 | Gaynes et al. | |
| 5,626,277 A | 5/1997 | Kawada | |
| 5,713,275 A | * 2/1998 | Imai | 101/119 |
| 6,138,562 A | * 10/2000 | Hertz et al. | 101/129 |
| 6,240,840 B1 | * 6/2001 | Murakami | 101/114 |
| 6,460,755 B1 | * 10/2002 | Inoue et al. | 228/246 |

FOREIGN PATENT DOCUMENTS

JP 238865 * 8/1994

* cited by examiner

Primary Examiner—Brian K. Talbot
(74) Attorney, Agent, or Firm—Sheppard Mullin Richter & Hampton LLP

(57) ABSTRACT

A method for depositing a conductive paste is disclosed. The method comprises aligning apertures in a stencil with conductive regions on a circuit structure, and screening conductive paste into apertures in the stencil. Conductive paste present in the stencil apertures is pushed through the stencil apertures using a pressurized fluid or an array of pin bodies.

22 Claims, 3 Drawing Sheets

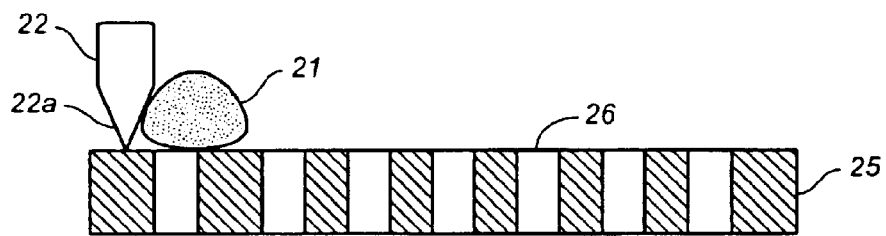
FIG._1A
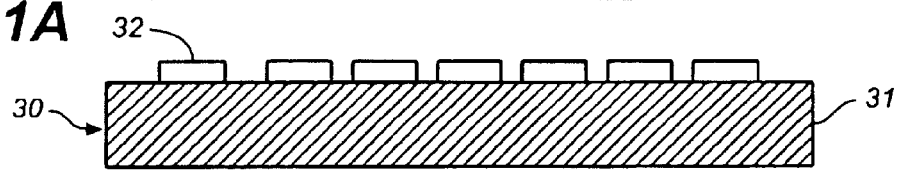
FIG._1B
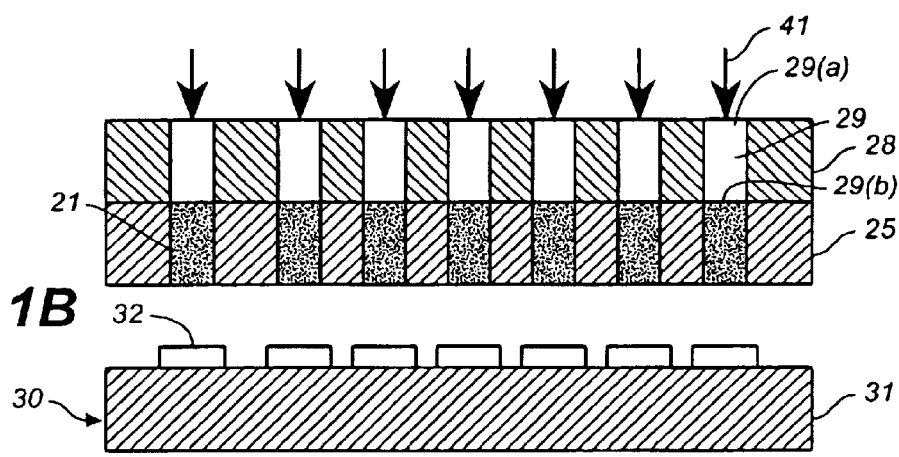
FIG._1C

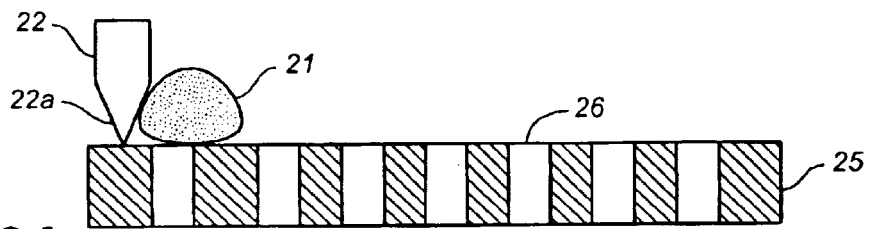
FIG._2A
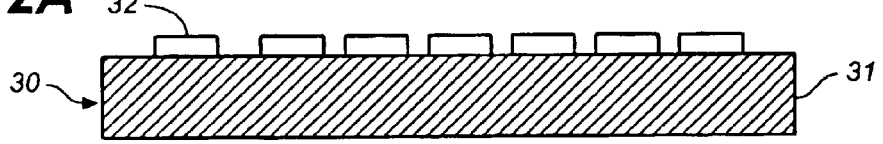
FIG._2B
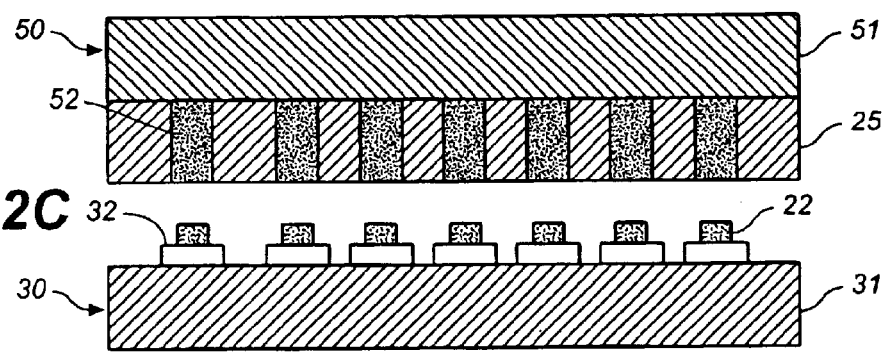
FIG._2C

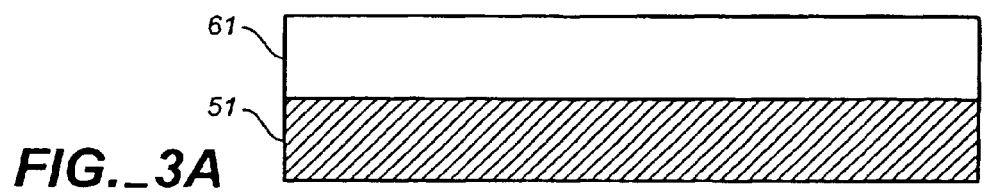
FIG._3A
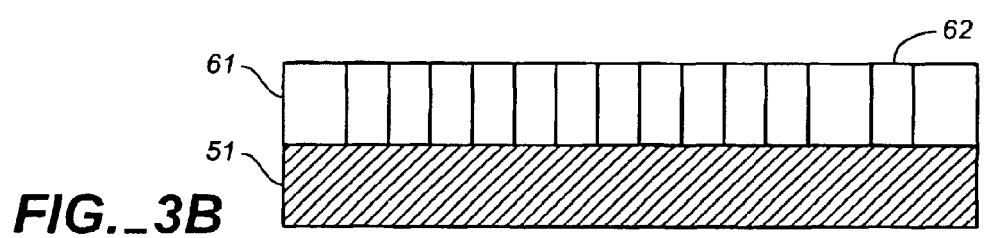
FIG._3B
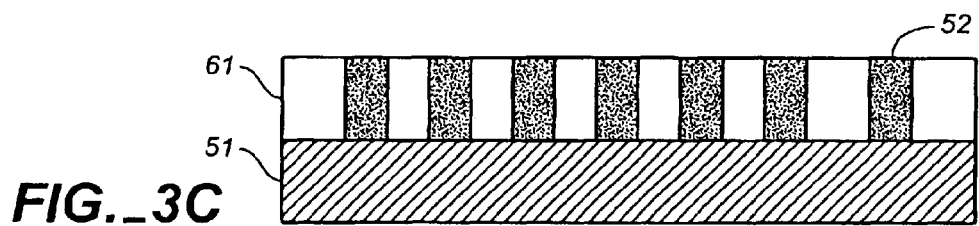
FIG._3C
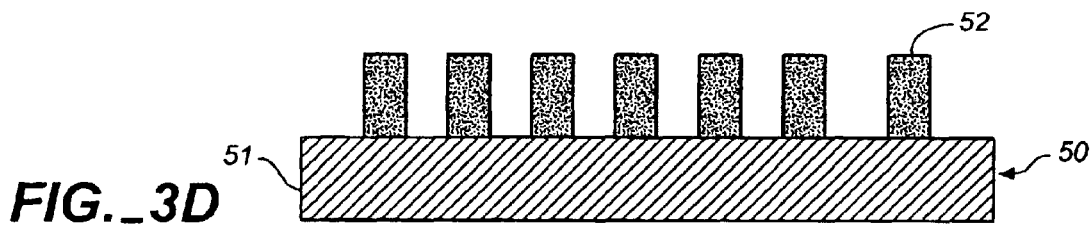
FIG._3D

US 6,730,358 B2

METHOD FOR DEPOSITING CONDUCTIVE PASTE USING STENCIL

BACKGROUND OF THE INVENTION

1. Field of the Invention

Embodiments of the present invention relate to depositing viscous materials. More specifically, embodiments of the present invention provide methods for depositing paste, in particular solder paste, on a circuit structure.

2. Description of the Prior Art

Chip modules such as multichip modules are widely used in the electronics industry. A typical chip module comprises a semiconductor chip mounted on a circuit substrate. Solder is used to connect the semiconductor chip to conductive regions on the circuit substrate.

In one conventional method for attaching the chip to the circuit substrate, solder paste is selectively deposited onto conductive regions of the circuit substrate using a stencil. The stencil is placed adjacent to the circuit substrate so that portions of the conductive regions are exposed through the stencil apertures. A squeegee pushes solder paste across the upper surface of the stencil and into the stencil apertures. The solder paste passes through the stencil apertures, and deposits onto the conductive region portions.

Problems can sometimes arise during solder stenciling. For example, the solder paste can stick to the aperture walls and may not deposit on the conductive regions. Consequently, some conductive regions may not have enough solder deposited on them, and the uniformity of the solder deposits across the circuit substrate can vary. If severe sticking occurs, the circuit substrate and the stencil are cleaned and the circuit substrate is re-soldered. Re-soldering and cleaning steps increase the time, labor and materials needed to form chip modules, and consequently increase the cost of the modules.

In another conventional method which addresses the solder sticking problem, an air nozzle is aligned with a stencil aperture. Air from the nozzle blows solder through the stencil aperture and onto a conductive region under the aperture. Then, the nozzle moves to another aperture and the process is repeated. While a method, such as this one, may be effective in some instances, a typical circuit substrate may include hundreds of conductive regions. Using a single pressurized air nozzle to deposit solder onto hundreds of conductive regions, one or even a few at a time, is time consuming. Moreover, in a method such as this one, complicated control systems are needed to align the nozzle with each successive stencil aperture.

Therefore, what is needed and what has been invented is an improved method for depositing a conductive paste. What is further needed and what has been more specifically invented is a method which does not possess the deficiencies of the prior art and which is capable of simultaneously dispensing numerous respective solder-paste deposits onto numerous conductive regions.

SUMMARY OF THE INVENTION

Embodiments of the invention provide methods for depositing a conductive paste on a circuit structure. In one embodiment of the invention, a method is provided for depositing a conductive paste comprising aligning apertures in a stencil with conductive regions of a circuit structure; screening conductive paste (e.g., solder) into at least a majority of the stencil apertures in the stencil; and supplying pressurized fluid (e.g., nitrogen or air) to the majority of stencil apertures substantially simultaneously. The method further comprises placing, after screening conductive paste, a pressurized fluid element adjacent to the stencil, wherein the pressurized fluid element includes pressurized fluid outlets which are in communication with the majority of stencil apertures. The pressurized fluid outlets in the pressurized fluid element may form the same pattern as the apertures in the stencil. Furthermore, planar dimensions of the pressurized fluid element are substantially the same as the planar dimensions of the stencil.

Another embodiment of the invention provides a method for depositing a conductive paste comprising aligning apertures in a stencil with conductive regions of a circuit structure; screening conductive paste (e.g., solder paste) into the stencil apertures in the stencil; and inserting an array of pin bodies (e.g., copper or nickel pin bodies) into the stencil apertures to push any conductive paste within the stencil apertures through the apertures. Screening conductive paste preferably comprises screening the conductive paste into a majority of the stencil apertures. Preferably, the number of pin bodies in the array is equal to the number of stencil apertures. The pin body lengths may range from about 50 and about 100 percent of the length of the apertures. The method for depositing a conductive paste further comprises subsequently withdrawing the array of pin bodies from the stencil apertures. The array of pin bodies may be present on a base and is preferably formed by plating. Each of the pin bodies has a length greater than about one-half the thickness of the stencil, and each of the axial crosssectional areas of the pin bodies is from about 80 to about 90 percent of the axial cross sectional area of the apertures.

Another embodiment of the invention provides a pushing element comprising a planar base; and an array of pins, wherein the array of pins are capable of being inserted into the apertures of a stencil to push conductive paste through the apertures. The outer surfaces of the base are preferably entirely metallic. Preferably, each of the pins has a length less than about 1 micron.

These provisions together with the various ancillary provisions and features which will become apparent to those skilled in the art as the following description proceeds, are attained by the methods of the present invention, preferred embodiments thereof being shown with reference to the accompanying drawings, by way of example only, wherein:

BRIEF DESCRIPTION OF THE DRAWINGS

FIGS. 1(a) to 1(c) show a sequence of cross-sections of structures in steps used to deposit a conductive paste on a circuit structure using a pressurized fluid.

FIGS. 2(a) to 2(c) show a sequence of cross-sections of structures in steps used to deposit a conductive paste on a circuit structure using an array of pin bodies.

FIGS. 3(a) to 3(d) show a sequence of cross-sections of structures in steps used to form a pushing element including a pin body array.

It is to be understood that for clarity of illustration, some drawings may not be to scale.

DETAILED DESCRIPTION OF PREFERRED EMBODIMENTS OF THE PRESENT INVENTION

Embodiments of the invention provide for a more efficient and more uniform conductive paste deposits than provided by many conventional methods. In preferred embodiments, conductive paste within substantially all stencil apertures can be removed from them in a single step. Complicated control and alignment systems, and multiple alignment steps are not needed to accomplish this task.

In embodiments of the invention, conductive paste is screened onto conductive regions using a stencil. An array of pin bodies or pressurized fluid may be used to help push the conductive paste through the stencil apertures so that they are relatively free of conductive paste. After a conductive paste is screened into stencil apertures, pin bodies or fluid outlets of a pressurized fluid element are aligned with the stencil apertures. The pin bodies are inserted into, or pressurized fluid is supplied to, the apertures in a stencil substantially simultaneously so that substantially all of the conductive paste remaining within the stencil apertures passes out of them and onto the conductive regions of the circuit structure.

Using embodiments of the invention, labor, processing time, and materials can be reduced so that the final product is produced more quickly and for less cost. Moreover, since substantially all of the conductive paste is removed from the stencil apertures, the amount of conductive paste deposited on the conductive regions of the circuit structure is maximized and the deposits are substantially uniform in volume. Less processing variations occur, and the likelihood that one or more conductive regions of a circuit substrate will not have enough or any conductive paste is decreased, resulting in higher yields.

The conductive paste may include any suitable material. The conductive paste may comprise conductive particles (e.g., in the range of 5 to 55 microns) having any suitable shape (e.g., spheres). Preferably, the conductive particles are solder particles so that the conductive paste is solder paste. Suitable solder materials include metal alloys such as Pb-Sn and In-Sn alloys. A fluxing agent, solvents, and binders may be optionally included to improve the properties of the paste (e.g., the flow characteristics). Because the conductive paste is pushed through the stencil apertures in embodiments of the invention, the conductive paste may be more viscous and may include more conductive particles than would otherwise be the case. Consequently, deposits of conductive material on the circuit structure may have increased conductivity.

Referring now to FIGS. 1(a) and 1(c) for describing embodiments of the invention using a pressurized fluid to deposit a conductive paste, there is seen in FIG. 1(a), a stencil 25 with a plurality of apertures 26 disposed above a circuit structure 30. The apertures 26 are aligned with the conductive regions 32 of the circuit structure 30.

The circuit structure 30 preferably has a dielectric layer 31 and a plurality of conductive regions 32 on it. However, the circuit structure 30 may be any suitable component with circuitry. For example, the circuit structure 30 may be a chip, a printed circuit board, or a printed wiring board. The conductive regions 32 of the circuit structure may have any suitable form, thickness, or material. For example, the conductive regions 32 may be lines or pads having any suitable thickness, such as about 6 microns or less, and may include metallic materials such as copper, gold, nickel, and chromium. The circuit structure 30 may also include one or more dielectric layers 31. The dielectric layers 31 may include any suitable material or have any suitable thickness. Preferably, the one or more dielectric layers 31 include a polymeric material (e.g., polyimide) or a ceramic material. In preferred embodiments, the dielectric layers 31 may include a thickness ranging from about 2 microns to about 50 microns.

After the stencil apertures 26 are aligned with conductive regions 32 on the circuit structure 30, conductive paste 21 is screened into or otherwise disposed in the apertures 26 using a coating element 22 having beveled end 22a. The coating element 22 may be, for example, a squeegee, a doctor blade, or the like. Screening the conductive paste 21 with a stencil 25 is preferably desirable. For example, when using a stencil, complicated machinery is typically not required to screen a conductive paste (e.g., conductive paste 21) onto conductive regions (e.g., conductive regions 32).

Preferably, the conductive paste 21 is screened into a majority of the apertures of the stencil 25. For example, if the stencil includes 100 or more apertures 26 then the conductive paste can be screened into at least 50 apertures in one pass of the coating element 22. In typical usage, the coating element 22 passes across the upper surface of the stencil 25. The conductive paste 21 to be deposited is disposed against the leading surface of the coating element 22. As the coating element 22 pushes the conductive paste 21 across the upper surface of the stencil 25, the conductive paste 21 passes into the individual apertures 26 of the stencil 25. Eventually, the conductive paste 21 passes through the stencil apertures 26 and onto the conductive regions 32 of the circuit structure 30.

The stencil 25 may be in the form of a metal or a polymeric sheet. Suitable metal stencils include molybdenum, titanium, stainless steel, or aluminum stencils. Suitable polymeric stencils include those formed from polyimide. Preferably, the stencil has a coefficient of thermal expansion substantially equal to that of the material of the circuit structure.

The stencil 25 may have any suitable dimensions. The stencil 25 may have a thickness ranging from about 0.001 micron to about 0.080 micron. The stencil apertures 26 may have any suitable width (e.g., diameter) including a width ranging from about 100 microns to about 900 microns. The apertures 26 may have any suitable pitch. The pitch of the apertures 26 may be less than about 1400 microns, preferably ranging from about 400 microns to about 1400 microns. Typically, the stencil apertures 26 are cylindrically shaped (as shown, e.g., in the FIG. 1(a)). However, the aperture walls forming the apertures 26 may converge within the stencil and diverge near the outer surfaces of the stencil so that portions of the apertures are shaped as opposing frustums, or shaped as an hour glass. In exemplary embodiments, the radial crosssectional areas of each of the apertures may be 90% or less than the surface areas of corresponding conductive regions (e.g., conductive regions 32) upon which the conductive paste 21 is deposited. For example, the radial cross-sectional area of a stencil aperture 26 may be 85% or less than a conductive pad which is disposed under the stencil aperture.

As best shown in FIG. 1(b), a pressurized fluid element 28 may be disposed over the stencil 25 to assist in the deposition of the conductive paste 21 onto the circuit structure 30. The pressurized fluid element 28 has fluid passages 29 with fluid outlets 29(b) corresponding to the apertures 26 in the stencil 25. The pressurized fluid element 28 is placed adjacent to the stencil 26 and the fluid outlets 29(a) are aligned with the stencil apertures 26. As shown in FIG. 1(b), each of the fluid passages 29 can communicate with a corresponding stencil aperture 26 via a fluid outlet 29(b). Once aligned, pressurized fluid 41 is supplied to the fluid inlets 29(a) of the pressurized fluid element 28. Pressurized fluid 41 passes through the fluid passages 29, out of the fluid outlets 29(a) and into the stencil apertures 26. The pressurized fluid 41 pushes the conductive paste 21 within the stencil apertures 21 out the stencil apertures 26 and onto the conductive regions 21 of the circuit structure 30. Consequently, substantially all of the conductive paste 21 within the apertures 26 of the stencil 25 can be removed from the stencil 25 in a single step.

As shown in FIG. 1(c), pressurized fluid 41 forces the conductive paste 21 through the stencil apertures 26 so that the stencil apertures 26 are substantially free of conductive paste 21. After the conductive paste 21 is deposited on the circuit structure 30, the deposited conductive paste 21 and the circuit structure 30 may be further processed or treated if desired (e.g., reflowed). Also, the pressurized fluid element 28 may be separated from the stencil 25 after the conductive paste 21 is deposited. A circuit element such as a chip can be mounted on the circuit structure 30 via the deposited conductive paste 21 to form a module such as a multichip module.

The pressurized fluid element 28 may have any suitable configuration. For example, as shown in FIG. 1(c), the pressurized fluid element 28 may include a plate with fluid passages 29 and fluid outlets 29(b). The pattern of fluid outlets 29(b) may correspond to the pattern of apertures 26 in the stencil 25. The diameter or width of each of the fluid outlets 29(b) may be substantially equal to the diameter or width of the stencil apertures 26. Also, the length and the width of the pressurized fluid element 28 may be substantially the same as the length and width of the stencil 25. For these or other embodiments, the pressurized fluid element 28 may be disposed within a frame holding the stencil. Pressurized fluid 41 may be supplied to the pressurized fluid element 28 by a plurality of tubes (not shown), each tube being coupled to the fluid inlets 29(a) of the pressurized fluid element 28 and supplying pressurized fluid to one or more fluid inlets 29(a).

In another embodiment (not shown), the pressurized fluid element may be a body having fluid inlets and fluid outlets connected by multiple internal fluid passages. Inside the pressurized fluid element, the fluid passages may begin at the fluid inlets and diverge into more fluid passages which eventually end with the fluid outlets. Pressurized fluid may be supplied to the pressurized fluid element through the fluid inlets. In general, the body can have fewer fluid inlets than fluid outlets. For example, the pressurized fluid element may have the same number of fluid outlets as the number of apertures present in the corresponding stencil, while the number of fluid inlets may be two or less. Fluid supply lines can be coupled to the fluid inlets to supply fluid to the pressurized fluid element.

The pressure of the fluid supplied to the pressurized fluid element can be controlled by using a controller (not shown). The controller may be used to help keep the pressure of the fluid at the fluid outlets constant. A shutoff switch may be used to stop (automatically or manually) the flow of pressurized fluid shortly after or before separating the stencil 25 from the circuit structure 30.

The pressurized fluid 41 may be a gas or a liquid. Preferably, the pressurized fluid is a gas. Suitable gases include inert gases such as nitrogen and air. Regardless of whether a gas or liquid is used, the fluid may be at any suitable pressure. The pressure of the pressurized fluid is preferably effective to remove conductive paste from the stencil apertures and does not substantially distort conductive paste deposits already present on the conductive regions 32 of the circuit structure 30.

Referring now to FIGS. 2(a) to 2(c) for describing embodiments of the invention which use a pushing element with an array of pin bodies, there is seen in FIG. 2(a) a stencil 25 with a plurality of apertures 26 is disposed above a circuit structure 30. In this example, the circuit structure 30 has a dielectric layer 31 and a plurality of conductive regions 32. The apertures 26 are aligned with the conductive regions 32 of the circuit structure 30. After the stencil apertures 26 are aligned with conductive regions 32 of the circuit structure 30, conductive paste 21 is screened into the apertures 26 using a coating element 22. The coating element 22 passes across the upper surface of the stencil 25 while the conductive paste 21 is disposed against the leading surface of the coating element 22. As the coating element 22 passes across the upper surface, the conductive paste 21 passes into the individual apertures 26 of the stencil 25. Eventually, the conductive paste 21 passes through the stencil apertures 26 and onto the conductive regions 32 of the circuit structure 30. Other details about the conductive paste screening step and the circuit structure are described above with reference to FIG. 1(a).

To assist the deposition of the conductive paste 21 onto the circuit structure 30, a pushing element 50 including a base 51 and an array of pin bodies 52 can be used to push the conductive paste 21 through the stencil apertures 26 and onto the conductive regions 32 of the circuit structure 30. As shown in FIG. 2(b), the pushing element 50 is disposed above the stencil 25, which has apertures 26 partially or fully filled with conductive paste 21. The pin bodies 52 can then be aligned with the apertures 26 in the stencil 25 and the pin bodies 52 can be inserted into the stencil apertures 26 (e.g., automatically or manually). As the pin bodies 52 are inserted into the stencil apertures 26, the pin bodies 52 push out any conductive paste 21 disposed within the apertures 26 and onto the conductive regions 21 of the circuit structure 31. Then, the pin bodies 52 are withdrawn from the apertures 26 and the circuit structure 31 can be further processed elsewhere. Conductive paste may then be deposited on another circuit structure in the same or different manner as described above.

The pin bodies 52 are disposed substantially perpendicular to the orientation of the base 51 of the pushing element 50. In this embodiment, the base 52 may serve as a common head for each of the pin bodies 52. The base may have planar dimensions substantially equal to the stencil 25. In these embodiments, the base can fit within, or be substantially coextensive with, a frame holding the stencil. The pin bodies 52 may comprise any suitable material. For example, the pin bodies 52 may comprise a metal such as nickel or copper. The base 51 may comprise the same or different material as the pin bodies 52. Preferably, the pin bodies 52 comprise a material which does not stick to the conductive paste 21.

The pin bodies 52 may also have any suitable dimension, and are preferably cylindrical in shape. The pin bodies 52 may have any suitable radial cross-sectional shape (e.g., circular, polygonal) or length. Preferably, the pin bodies 52 have a length which is greater than about 40% (e.g., between about 50% and 100%) of the lengths of the apertures 26 in which they are inserted. For example, if the length of a stencil aperture 26 is at least 0.002 micron deep or long, such as from about 0.002 micron to about 0.01 micron, then the length of the pin bodies 52 may be at least about 0.008 micron, such as from about 0.008 micron to about 0.01 micron or longer. The pin bodies 52 may also have any suitable radial cross-sectional area. For example, the pin bodies 52 may have a radial cross-sectional area of greater than about 80% of the radial cross-sectional area of the area. The pin body width or diameter may also be greater than about 80% of the width (e.g., diameter) of the aperture 26 in which it is inserted. Typically, the diameter of the pin body may range from about 0.001 micron to about 0.006 micron.

The pushing element 50 and the pin bodies may be formed in any suitable manner. For example, the pin bodies of the pushing element may be formed using a subtractive process such as micromachining. Preferably, the pushing element 50 is formed by using an additive process.

Referring now to FIGS. 3(*a*) to 3(*d*) for describing exemplary additive processes, there is seen in FIG. 3(*a*) a masking layer 61 formed on a base 51. The base 51 may be a metallic material such as copper. As shown in FIG. 3(*b*), a number of apertures 62 are formed in the masking layer 61. The location of the apertures 62 in the masking layer 61 substantially correspond to the location of the stencil apertures 26 in which the formed pin bodies will be inserted. The thickness of the deposited masking layer 61 may be greater than the lengths of the pin bodies 52 to be formed.

The apertures 62 may be formed in the masking layer 61 by any suitable process. For example, the masking layer 61 may comprises a photoresist material. Selected areas of the photoresist material may be irradiated and developed to form a plurality of apertures. In another embodiment, the masking material may be irradiated with a laser so that selected areas of the masking material are ablated.

After the apertured masking layer 61 is formed over the base, a plurality of pin bodies 52 are formed within the apertures 62. For example, sputtering may be used to deposit a pin body forming material within the apertures 62. In preferred embodiments, the pin bodies are plated within the apertures 62 of the masking layer 61 using an electrolytic or electroless plating process. For example, the structure shown in FIG. 3(*b*) may be immersed in a plating bath and plating can initiate from the exposed surface of the base to the open ends of the apertures 62 in the masking layer 61. If the base 51 includes a metallic surface, the metallic surface exposed through the masking layer apertures 61 may serve to initiate plating. In some embodiments, the entire outer surface of the base 51 is metallic. Alternatively, the base 41 may be coated with a seed layer (not shown) prior to forming the apertured masking layer 61 on the base 51. The seed layer may be used to initiate the plating process.

After the pin bodies 52 are formed, the masking layer 61 may be removed. For example, if the masking layer 61 comprises a photoresist, the photoresist may be removed by stripping it in an appropriate stripping medium. Alternatively, the masking layer 61 may be removed using a plasma etch or other material removal process.

As shown in FIG. 3(*d*), the remaining structure is a pushing element 50 having a base 51 and a plurality of pin bodies 51 disposed substantially perpendicular to the orientation of the base 51. The base 51 can serve as a common head for all of the pin bodies 52.

The pushing element 50 having a specific pin body array configuration can be formed relatively quickly and easily. This can be advantageous if, for example, many different stencils are used in a production facility for many different types of products. Pushing elements can be formed for each stencil and can be used with the stencils during the deposition of the conductive paste.

Practice of embodiments of the present invention provide a number of advantages. For example, by using embodiments of the invention, the uniformity (volume and compositional) of the deposited paste is improved and the amount of paste which is deposited on the conductive regions of the circuit structure is increased. Pin bodies or pressurized fluid can be used to push any conductive paste, which might otherwise remain on the stencil, through the stencil apertures and onto the circuit structure. Processing time, labor and materials can be reduced, thus reducing the cost of the product to be formed.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for depositing a conductive paste comprising:
   aligning apertures in a stencil with conductive regions of a circuit structure;
   disposing conductive paste in a plurality of the stencil apertures;
   placing a pressurized fluid element adjacent to the stencil, wherein the pressurized fluid element includes a plurality of pressurized fluid outlets, and wherein each of the pressurized fluid outlets are aligned with a respective one of the plurality of stencil apertures; and
   supplying pressurized fluid through the plurality of pressurized fluid outlets to the conductive paste in the plurality of stencil apertures substantially simultaneously, so that the conductive paste in the plurality of stencil apertures is deposited onto the conductive regions of the circuit structure.

2. The method of claim 1 wherein the conductive paste comprises solder.

3. The method of claim 1 wherein the pressurized fluid outlets in the pressurized fluid element form the same pattern as the apertures in the stencil.

4. The method of claim 1 wherein the planar dimensions of the stencil pressurized fluid element are substantially the same as the planar dimensions of the stencil.

5. The method of claim 1 wherein the pressurized fluid comprises nitrogen or air.

6. The method of claim 1 wherein substantially all of said conductive paste within the stencil apertures of the stencil are removed therefrom by the pressurized fluid in a single step.

7. The method of claim 1 wherein said step of disposing conductive paste comprises depositing conductive paste on the stencil; and passing a coating element in one pass over the stencil to dispose conductive paste into the stencil apertures.

8. The method of claim 7 wherein said stencil includes 100 or more stencil apertures.

9. The method of claim 7 wherein said coating element comprises a beveled end.

10. A method for depositing a conductive paste comprising:
   aligning apertures in a stencil with conductive regions of a circuit structure;
   disposing conductive paste in the apertures of the stencil
   placing an array of pin bodies adjacent to the top surface of the stencil, wherein each pin body is aligned with a respective stencil aperture and wherein each pin body has an axial cross-sectional area in the range of between about 80% and about 90% of the axial cross-sectional area of the aperture with which it is aligned; and
   inserting the array of pin bodies into their respective stencil apertures so that any conductive paste within the respective stencil apertures is pushed through the stencil and deposited on the conductive regions of the circuit structure.

11. The method of claim 10 wherein the step of disposing conductive paste comprises screening the conductive paste into a plurality of the stencil apertures.

12. The method of claim 10 wherein the number of pin bodies in the array is equal to the number of stencil apertures.

13. The method of claim 10 further comprising after inserting:
   withdrawing the array of pin bodies from the stencil apertures.

14. The method of claim 10 wherein the array of pin bodies are formed by plating.

15. The method of claim 10 wherein the stencil has a thickness, and each of the pin bodies have a length greater than one-half the thickness of the stencil.

16. The method of claim 10 wherein the conductive paste is solder paste.

17. The method of claim 10 wherein the pin body lengths are between about 50 and 100 percent of the length of the apertures.

18. The method of claim 10 wherein the pin bodies comprise copper or nickel.

19. The method of claim 11 wherein said screening comprises:
   depositing conductive paste on the top surface of the stencil; and
   passing a coating element in one pass over the top surface of the stencil to dispose conductive paste into the stencil apertures.

20. The method of claim 19 wherein said stencil includes 100 or more stencil apertures.

21. The method of claim 19 wherein said coating element comprises a beveled end.

22. A method for depositing a conductive paste comprising:
   aligning apertures in a stencil with conductive regions of a circuit structure;
   disposing conductive paste in the apertures of the stencil;
   placing an array of pin bodies adjacent to the top surface of the stencil, wherein each pin body is aligned with a respective stencil aperture and wherein each pin body has a length in the range of between about 50% and about 100% of the length of the aperture with which it is aligned; and
   inserting the array of pin bodies into their respective stencil apertures so that any conductive paste within the respective stencil apertures is pushed through the stencil and deposited on the conductive regions of the circuit structure.

* * * * *